(12) United States Patent
Hironaka et al.

(10) Patent No.: US 9,343,525 B2
(45) Date of Patent: May 17, 2016

(54) ALUMINUM NITRIDE SUBSTRATE AND GROUP-III NITRIDE LAMINATE

(71) Applicant: Tokuyama Corporation, Yamaguchi (JP)

(72) Inventors: Keiichiro Hironaka, Yamaguchi (JP); Toru Kinoshita, Yamaguchi (JP)

(73) Assignee: Tokuyama Corporation, Yamaguchi (JP)

( * ) Notice: Subject to any disclaimer, the term of this patent is extended or adjusted under 35 U.S.C. 154(b) by 0 days.

(21) Appl. No.: 14/427,156

(22) PCT Filed: Sep. 4, 2013

(86) PCT No.: PCT/JP2013/073806
§ 371 (c)(1),
(2) Date: Mar. 10, 2015

(87) PCT Pub. No.: WO2014/042054
PCT Pub. Date: Mar. 20, 2014

(65) Prior Publication Data
US 2015/0249122 A1    Sep. 3, 2015

(30) Foreign Application Priority Data

Sep. 11, 2012    (JP) .................................. 2012-199685

(51) Int. Cl.
*H01L 29/04*    (2006.01)
*C30B 25/18*    (2006.01)
(Continued)

(52) U.S. Cl.
CPC ............... *H01L 29/045* (2013.01); *B82Y 20/00* (2013.01); *C30B 25/186* (2013.01); *C30B 29/403* (2013.01); *C30B 29/68* (2013.01); *H01L 29/2003* (2013.01); *H01L 33/16* (2013.01); *H01S 5/343* (2013.01); *H01L 21/0254* (2013.01); *H01L 21/0262* (2013.01); *H01L 21/02389* (2013.01); *H01L 21/02433* (2013.01); *H01L 33/02* (2013.01); *H01L 33/32* (2013.01);
(Continued)

(58) Field of Classification Search
CPC .... H01L 29/045; H01L 29/2003; H01L 33/16
See application file for complete search history.

(56) References Cited

U.S. PATENT DOCUMENTS

| 8,026,523 B2 | 9/2011 | Fujikura | |
| 8,420,419 B2 * | 4/2013 | Takagi | B82Y 20/00 257/E21.085 |

(Continued)

FOREIGN PATENT DOCUMENTS

| JP | H11233391 A | 8/1999 |
| JP | 2007005526 A | 1/2007 |

(Continued)

OTHER PUBLICATIONS

PCT International Application PCT/JP2013/073806, Transmittal of International Preliminary Report on Patentability, dated Sep. 2013.
(Continued)

*Primary Examiner* — Allan R Wilson
(74) *Attorney, Agent, or Firm* — Cahn & Samuels, LLP (57) ABSTRACT

A substrate includes aluminum nitride, wherein the aluminum nitride substrate has on at least a surface thereof an aluminum nitride single-crystal layer having as a principal plane a plane that is inclined 0.05° to 0.40° in the m-axis direction from the (0001) plane of a wurzite structure.

6 Claims, 1 Drawing Sheet

(51) Int. Cl.
*C30B 29/40* (2006.01)
*C30B 29/68* (2006.01)
*B82Y 20/00* (2011.01)
*H01L 29/20* (2006.01)
*H01L 33/16* (2010.01)
*H01L 33/32* (2010.01)
*H01L 33/02* (2010.01)
*H01S 5/02* (2006.01)
*H01S 5/32* (2006.01)
*H01S 5/343* (2006.01)
*H01L 21/02* (2006.01)

(52) U.S. Cl.
CPC ............. *H01S5/0206* (2013.01); *H01S 5/3202* (2013.01); *H01S 5/34333* (2013.01)

(56) References Cited

U.S. PATENT DOCUMENTS

| | | | |
|---|---|---|---|
| 8,624,220 B2* | 1/2014 | Horie | H01L 21/0254 257/13 |
| 2008/0187016 A1 | 8/2008 | Schowalter et al. | |
| 2008/0272392 A1* | 11/2008 | Ishibashi | C30B 29/403 257/103 |
| 2009/0114943 A1 | 5/2009 | Fujikura | |
| 2010/0244087 A1* | 9/2010 | Horie | C30B 25/02 257/103 |
| 2010/0252835 A1 | 10/2010 | Horie | |
| 2011/0049544 A1* | 3/2011 | Komada | H01L 21/0242 257/97 |
| 2011/0253974 A1* | 10/2011 | Horie | H01L 21/0254 257/13 |
| 2013/0082279 A1* | 4/2013 | Faurie | H01L 21/3245 257/76 |
| 2013/0292802 A1 | 11/2013 | Ishibashi et al. | |
| 2014/0073118 A1* | 3/2014 | Horie | H01L 21/0254 438/478 |
| 2014/0077154 A1* | 3/2014 | Shatalov | H01L 29/155 257/13 |
| 2014/0349112 A1 | 11/2014 | Ishibashi et al. | |

FOREIGN PATENT DOCUMENTS

| | | |
|---|---|---|
| JP | 2009132569 A | 6/2009 |
| JP | 2009135441 A | 6/2009 |
| JP | 2009147319 A | 7/2009 |
| JP | 2010030799 A | 2/2010 |

OTHER PUBLICATIONS

English Abstract of JP H11233391.
English Abstract of JP 2007005526.
English Abstract of JP 2009135441.
English Abstract of JP 2009132569.
English Abstract of JP 2010030799.
English Abstract of JP 2009147319.
Shen et al., "Surface step morphologies of GaN films grown on vicinal sapphire (0001) substrates by rf-MBE", Journal of Crystal Growth, 300 (2007) 75-78.

* cited by examiner

ALUMINUM NITRIDE SUBSTRATE AND GROUP-III NITRIDE LAMINATE

This application is a U.S. national stage application of PCT/JP2013/073806 filed on 4 Sep. 2013, and claims priority to Japanese patent document 2012-199685 filed on 11 Sep. 2012, the entireties of which are incorporated herein by reference.

TECHNICAL FIELD

The present invention relates to a novel aluminum nitride substrate. Specifically, the present invention relates to the novel aluminum nitride substrate comprising an aluminum nitride single crystal layer having an plane inclined in a particular direction as a principal plane.

DESCRIPTION OF THE RELATED ART

The aluminum nitride has a wide forbidden band gap of 6.2 eV and is a semiconductor with direct band gap. Therefore, a mixed crystal of group III nitride semiconductors such as aluminum nitride, a gallium nitride (GaN) and indium nitride (InN), particularly the mixed crystal having 50 atom % or more of Al composition in group III nitride semiconductors (hereinafter, it may be referred as "Al based group III nitride single crystal") is promising material for ultraviolet light emitting element.

In order to form the semiconductor element such as the ultraviolet light emitting element, a multilayered structure including a clad layer and an active layer must be formed between n-type semiconductor layer which is electrically bonded to n-electrode and p-type semiconductor layer which is electrically bonded to p-electrode. Also, it is important that all of the layers have high crystalline quality such as low dislocation density including point defect, uniformity of crystal composition distribution and low impurities from the view point of the luminous efficiency.

In order to form the multilayered structure with high crystalline quality, it is essential that such structure has not only the uniformity of the crystal disposition but also highly flat surface on the grown layer. When the crystal layer is grown with highly flat surface, the grown layer with low impurity and without composition fluctuation in plane can be obtained, resulting in achieving light emitting element with high luminous efficiency. The quantum well layer, which is the light emitting layer usually have a fine structure of several nm unit, hence the flatness of the quantum well layer surface is particularly important. By having flat surface, the composition distribution and the impurities concentration in plane will be improved.

In regards with the flatness of the growth surface, several examples have been reported which examines an off angle of surface thereof (the principal plane) at the substrate for the crystal growth on whose surface the group III nitride single crystal is grown. For example, the method using the sapphire substrate as the substrate for crystal growth, and growing nitride gallium (GaN) on the sapphire substrate comprising particular off angle is known (for example, refer to the non-patent article 1). Also, as the substrate for crystal growth, the example which defines the off angle of silicon carbide (SiC) substrate is known (for example, the patent article 1).

According to the non-patent article 1, when aluminum nitride buffer layer and GaN layer are grown on a sapphire substrate having a plane inclined at 0.5° to 2° from c-plane ((0001) plane) as the principal plane, the smaller the off angle is, the more improved the flatness of the growth surface is. This is because high quality crystal with high flatness is obtained as the molecular step (hereinafter, it may be simply referred as step) are regularly arranged on the surface by inclining the substrate surface within the appropriate range from the c-plane, and the atomic species supplied to the substrate surface can be easily incorporated into step when growing the group III nitride single crystal.

However, since sapphire substrate is heterogeneous toward group III nitride, it is not suitable as a substrate for crystal growth of the group III nitride. This will cause the crystal defect or cracks due to the misfit of lattice constant between the sapphire substrate and the group III nitride, and thus the high quality crystal layer cannot be obtained. Also, sapphire substrate is disadvantageous since thermal expansion coefficient of sapphire is different from that of group III nitride, which is grown under high temperature. For the same reason, SiC substrate is not suitable as well. Particularly, this tendency becomes prominent in case the Al based group III nitride single crystal is grown with mixed crystal having 50 atom % or more of Al composition in the group III element necessary for forming the ultraviolet light emitting element.

Therefore, there is an example reported wherein the group III nitride substrate is used as the substrate for the crystal growth, and limiting the off angle thereof (for example, the patent article 2). Specifically, the method of carrying out the epitaxial growth of the semiconductor on the group III nitride substrate which is parallel to c-plane (having the off angle of less than 0.05° with respect to c-plane), or having the off angle of 0.05° or more and 15° or less against c-plane is described. It is described that by making the off angle substantially parallel to c-plane, the semiconductor layer with high crystallinity can be obtained, and can obtain high quality devices. On the other hand, it describes that by making it to 0.05° or more and 15° or less, the semiconductor layer with low defect can be formed.

This patent article 2 describes about the group III nitride substrate comprising off angle of 0° or more and 15° or less against c-plane, however in the examples thereof, off angle of the group III nitride substrate is not specifically described. Further, the example where the semiconductor layer made of the mixed crystal having 20 atom % or less of Al composition on the aluminum nitride single crystal substrate with the surface roughness (Ra) of 0.09 to 0.41 nm finished by a chemical mechanical polishing (CMP) is shown. The device obtained from this example (the semiconductor element wherein the semiconductor layer is layered on the aluminum nitride single crystal substrate) has high optical output (as it is a semiconductor device having good characteristic), therefore it is thought to be using the aluminum nitride single crystal substrate which is parallel to c-plane (comprising the off angle of less than 0.05° with respect to c-plane).

The patent article 3 discloses the self-standing nitride semiconductor substrate, specifically of GaN substrate, comprising off angle (θ) of 0.03 to 1.0° with respect to c-plane and deviation angle (φ) of 0.5 to 1.6° with respect to "m" axis direction of the off direction, but not including the area of −0.5°<φ<0.5°.

PRIOR ARTS

[Non-Patent Article 1] X. Q. Shen and H. Okumura, Journal of Crystal Growth, 300(2007) 75-78

[Patent Article 1] Japanese Patent Application Laid Open No. H11-233391

[Patent Article 2] Japanese Patent Application Laid Open No. 2007-5526

[Patent Article 3] Japanese Patent Application Laid Open No. 2009-135441

DISCLOSURE OF INVENTION

In case of producing the deep ultraviolet light emitting element, as discussed above, it is necessary to have the mixed crystal layer of the group III nitride single crystal including Al (for example, the mixed crystal layer made of AlGaN or so). In such case, by using aluminum nitride single crystal substrate having close lattice constant with said mixed crystal layer as the substrate for crystal growth to which said mixed crystal layer is layered, it is thought that the high quality light emitting layer with extremely low dislocation can be formed. The higher the ratio of Al is, the more suitable it is to use aluminum nitride single crystal substrate when the mixed crystal layer is layered which is made of Al based group III nitride single crystal having 50 atom % or more of Al composition.

Therefore, in accordance with the method as described in the patent article 2, the present inventors have grown the mixed crystal layer made of the group III nitride single crystal having 50 atom % or more of Al composition on the aluminum nitride single crystal substrate. As a result, it was found that following points can be further improved. Specifically, when the mixed crystal layer made of the group III nitride single crystal having 50 atom % or more of Al composition on the surface (the principal plane) of the aluminum nitride single crystal substrate having the surface roughness (Ra) of 0.40 nm or less, and the off angle of 0° or more and 15° or less, then the flatness of mixed crystal layer declined, and the fluctuation of the composition distribution of the mixed crystal layer became wider or the impurity concentration increased in some cases. That is, in case of growing the mixed crystal layer made of the group III nitride single crystal having 50 atom % or more of Al composition, the conventional art cannot be applied for improving the flatness of mixed crystal layer, and to have uniform composition distribution or to reduce the impurity concentration. Particularly, it became apparent that it was necessary to further improve the flatness of mixed crystal layer, and to have uniform composition distribution or to reduce the impurity concentration, even more than in case of using the aluminum nitride single crystal substrate which is parallel to the c-plane (comprising the off angle of less than 0.05° against c-plane).

Also, when the method described in the patent article 3 which only specifically show GaN substrate as an example is applied to the substrate comprising the aluminum nitride single crystal layer, it was found that even in such case, the fluctuation of the composition distribution of the mixed crystal layer became wider or the impurity concentration increased in some cases.

Therefore, the object of the present invention is to provide the substrate made of aluminum nitride which can grow the high quality group III nitride single crystal layer having good flatness, uniform composition distribution and low impurity concentration.

Particularly, the object of the present invention is to provide the aluminum nitride substrate which have high flatness of the growth surface of the growth layer, and uniform composition distribution of the growth layer with low impurity concentration, in case of growing AlGaInBN layer which satisfies a composition shown by $Al_{1-(x+y+z)}Ga_xIn_yB_zN$ (note that, x, y, and z are independently a rational number of 0 or more and less than 0.5 respectively, and a sum of x, y, and z is less than 0.5).

Further, other object of the present invention is to provide high quality light emitting element.

The present inventors have carried out intensive examination in order to solve the above objects. Then, considering the physical properties of the thermal expansion or so, various conditions were examined which allows to grow high quality group III nitride single crystal in case of using the substrate made of the aluminum nitride as the substrate for the crystal growth. Among these, when the off angle of the plane where the crystal of the substrate made of aluminum nitride is grown (the grown surface) was examined, by controlling the off angle of the aluminum nitride substrate stricter than that of the conventional ones, it was found that the above mentioned objects can be solved, thereby the present invention was attained.

That is, the first present invention is an aluminum nitride substrate, wherein said aluminum nitride substrate comprising at least on a surface thereof an aluminum nitride single crystal layer having a principal plane inclined to "m" axis direction within a range of 0.05° or more and 0.40° or less from (0001) plane of a wurzite structure. In the aluminum nitride substrate of the present invention, said principal plane is preferably inclined in "a" axis direction within a range of 0.00° or more and 0.40° or less.

Also, the second present invention is the group III nitride layered product comprising AlGaInBN layer which satisfies a composition shown by $Al_{1-(x+y+z)}Ga_xIn_yB_zN$ (note that, x, y, and z are independently a rational number of 0 or more and less than 0.5 respectively, and a sum of x, y, and z is less than 0.5) on the principal plane of the aluminum nitride single crystal layer.

According to the present invention, in said $Al_{1-(x+y+z)}Ga_xIn_yB_zN$, the group III nitride layered product comprising AlGaInBN layer having a composition that x is a rational number of more than 0 and less than 0.5, y and z are rational number of 0 or more and less than 0.5, and a sum of x, y, and z is more than 0 and less than 0.5; and the group III nitride layered product wherein in photoluminescence measurement at 300 K of said AlGaInBN layer, a luminescence peak corresponding to the band gap of said AlGaInBN layer of 4.56 eV or more and less than 5.96 eV is observed, and full width at half maximum (FWHM) is 225 meV or less can be obtained easily.

Also, the group III nitride layered product, wherein AlN layer (x, y and z being 0 in said $Al_{1-(x+y+z)}Ga_xIn_yB_zN$) is directly formed on the principal plane of said aluminum nitride single crystal layer, in photoluminescence measurement at 300 K of said AlN layer, a full width at half maximum (FWHM) of a luminescence peak corresponding to the band gap of said AlN crystal is 145 meV or less, and a surface roughness (Ra) of said AlN layer is 0.2 nm or less can be obtained. Note that, luminescence corresponding to band gap refers to the specific luminescence of the crystal generated by the re-bonding of the hole of the upper end of the valance band and electron at the bottom of the valance band, and this luminescence energy reflects the composition of the crystal.

Also, the luminescence wavelength λ (nm) and the energy E (eV) corresponding thereto can be converted by the equation of $E=1240/λ$.

Further, the third invention s is the group III nitride semiconductor element at least comprising the aluminum nitride single crystal layer, and said AlGaInBN layer part of the group III nitride layered product.

By using the aluminum nitride substrate of the present invention as the substrate for the crystal growth of the group III nitride single crystal layer, the flatness of the growth surface of the group III nitride single crystal layer can be improved. Also, the composition distribution of the group III nitride single crystal layer can be further uniform, and the impurity concentration can be made low. As a result, a high quality light emitting device element can be produced.

Among these, the aluminum nitride substrate of the present invention exhibits particularly excellent effect in case of growing AlGaInBN layer which satisfies the composition of $Al_{1-(x+y+z)}Ga_xIn_yB_zN$ which has close lattice constant (note that, x, y, and z are independently a rational number of 0 or more and less than 0.5 respectively, and a sum of x, y, and z is less than 0.5) thereon. Therefore, the group III nitride layered product comprising aluminum nitride substrate of the present invention can be used as the deep ultraviolet light emitting element.

DETAILED DESCRIPTION OF INVENTION

The present invention is the substrate made of aluminum nitride, wherein the aluminum nitride substrate comprises the aluminum nitride single crystal layer comprising a plane with particular off angle as the principal plane on the surface. The aluminum nitride substrate of the present invention is the substrate for the crystal growth wherein the group III nitride single crystal layer is grown on the principal plane of the aluminum nitride single crystal layer. Also, the present invention uses the layered product including the aluminum nitride single crystal layer part and the group III nitride single crystal layer thereon as light emitting element.

First, the aluminum nitride substrate will be explained.
(Aluminum Nitride Substrate)

Figure 1:
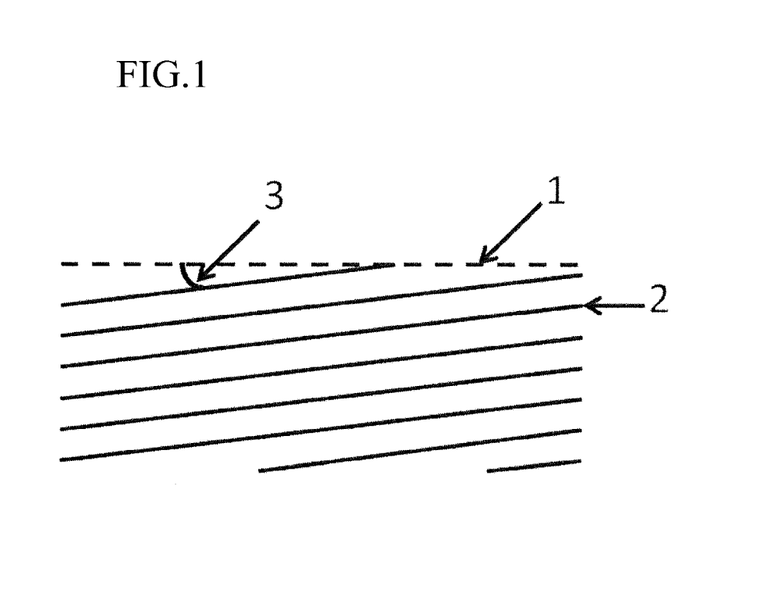
FIG. 1 is a cross section of the aluminum nitride substrate according to an embodiment of the present invention.

FIG. 1 shows the schematic cross section of the aluminum nitride substrate of the present invention. The aluminum nitride substrate of the present invention is made of aluminum nitride, wherein said aluminum nitride substrate comprises at least on a surface thereof an aluminum nitride single crystal layer having a plane inclined to "m" axis direction within a range of 0.05° or more and 0.40° or less from (0001) plane of a wurzite structure as the principal plane. That is, the aluminum nitride substrate comprising at least on the surface of the aluminum nitride single crystal layer wherein the off angle 3 which is the angle between the principal plane 1 and the c-plane 2 of the aluminum nitride is 0.05° or more and 0.40° or less. Note that, said principal plane is a part having the largest area of the aluminum nitride single crystal layer, and it is the plane which is the surface of the aluminum nitride substrate. Further, on said principal plane, the group III nitride, for example AlGaInBN layer which will be described in detail in below is grown.

The aluminum nitride substrate is made only from aluminum nitride. That is, the aluminum nitride substrate of the present invention does not include the layered substrate such as the single crystal layer made of aluminum nitride formed on the sapphire or SiC substrate or so. If the substrate including the different material (sapphire, SiC) is used as such, a high quality group III nitride layered product cannot be obtained, which is thought to be caused by the lattice constant difference and the thermal expansion difference of the group III nitride single crystal layer. Particularly, it becomes difficult to reduce the dislocation density of the group III nitride layered product.

The aluminum nitride substrate of the present invention comprises at least on a surface thereof an aluminum nitride single crystal layer having a plane inclined to "m" axis direction within a range of 0.05° or more and 0.40° or less from (0001) plane of a wurzite structure as the principal plane. Therefore, as long as it comprises the aluminum nitride single crystal layer, the aluminum nitride single crystal layer may be single substrate or a multilayered substrate. In case of a multilayered substrate, it only needs to be those having the aluminum nitride single crystal layer on the substrate composed of polycrystalline layer or amorphous layer (a non-single crystal layer) made of aluminum nitride. Note that, in case the group III nitride layered product and group III nitride semiconductor element are produced using the multilayered aluminum nitride substrate comprising polycrystalline layer or amorphous layer (non-single crystal layer), said non-single crystal layer can be removed. That is, the group III nitride layered product of the present invention and the group III nitride semiconductor element of the present invention only needs to include the aluminum nitride single crystal layer part.

Also, the aluminum nitride substrate of the present invention may be those having the aluminum nitride single crystal layer with different impurity concentration. In this case, the part which becomes the aluminum nitride single crystal layer preferably has low impurity.

In the aluminum nitride substrate of the present invention, the principal plane of the aluminum nitride single crystal layer where the group III nitride is grown (the surface of the aluminum nitride substrate) must be the plane inclined to "m" axis direction within a range of 0.05° or more and 0.40° or less from (0001) plane of a wurzite structure. As the principal plane is the plane inclined to "m" axis direction within said range, the surface of the group III nitride single crystal layer grown thereon can be made flat, the composition distribution can be uniform, and the impurity concentration can be made low. It is not preferable that angle of the principal plane inclined to "m" axis is less than 0.05°, because steps in a regular order are not formed on growing surface, and will be a growth mode starting from random core formation, and the roughness at the grown surface becomes large. It is not also preferable that the angle of the principal plane inclined to "m" axis direction is larger than 0.40°, because so called step bunching where the difference between the steps are not formed from a monoatomic layer but from several atomic layer, is formed then, and the roughness at the grown surface becomes large. This is because when the roughness of the grown surface becomes large, a part of the atom forming the mixed crystal segregates and causes the composition distribution to fluctuate or the impurity concentration to increase. In order to form the flat and regularly ordered surface in which the step of the grown surface is made of the monoatomic layer, the principal plane is preferably the plane inclined to "m" axis direction within a range of 0.05° or more and 0.35° or less from (0001) plane of a wurzite structure. More preferably, it is the plane inclined to "m" axis direction within a range of 0.10° or more and 0.35° or less, and particularly the plane inclined to "m" axis direction within a range of 0.11° or more and 0.32° or less.

In such aluminum nitride substrate, the direction of the off angle, that is the direction wherein the angle between the c-plane and the aluminum nitride substrate surface (the principal plane) becomes maximum, there is "a" axis direction other than "m" axis direction. In the present invention, if the principal plane of the aluminum nitride single crystal layer is the plane inclined to "m" axis direction within a range of 0.05° or more and 0.40° or less from (0001) plane of a wurzite structure, then the angle inclined to this "a" axis direction is not particularly limited. Note that, in order to produce higher quality group III nitride layered product, it is preferable that the principal plane of the aluminum nitride single crystal layer is the plane inclined to "a" axis direction within a range of more than 0.00° and 0.40° or less from (0001) plane of a wurzite structure.

When said principal plane is inclined to "m" axis direction within said range from (0001) plane of a wurzite structure, by using the plane which is completely not inclined to "a" axis direction, high quality group III nitride single crystal layer with excellent flatness of the surface, with uniform composition distribution and low impurity concentration can be produced on the plane thereof. Also, in case said principal plane is inclined to "m" axis direction within said range from (0001) plane of a wurzite structure, and also inclined to "a" axis direction within a range of 0.00° or more and 0.40° or less, the step formation is further stabilized, and the group III nitride single crystal layer can be stably grown. Among these, preferably, said principal plane is inclined to "m" axis direction within a range of 0.05° or more and 0.35° or less from (0001) plane of a wurzite structure and inclined to "a" axis direction within a range of 0.05° or more and 0.35° or less; more preferably it is inclined to "m" axis direction within a range of 0.10° or more and 0.35° or less and inclined to "a" axis direction within a range of 0.10° or more and 0.35° or less; and particularly preferably it is inclined to "m" axis direction within a range of 0.11° or more and 0.32° or less and inclined to "a" axis direction within a range of 0.11° or more and 0.32° or less.

Note that, the off angle of the principal plane of the aluminum nitride single crystal layer can be measured by known methods. Specifically, it can be obtained from X ray measurement. In the present invention, the off angle of the principal plane of the aluminum single crystal layer having against "m" and "a" axis direction with respect to c-plane of the aluminum nitride single crystal layer may be measured.

In the present invention, the aluminum nitride single crystal layer is not particularly limited as long as the off angle of "m" axis direction satisfies said ranges, however it is preferable to have following physical properties. For example, the dislocation density of the aluminum nitride single crystal is preferably $1 \times 10^6$ cm$^{-2}$ or less. The total impurity amount of O, Si, C, B included in the aluminum nitride single crystal layer is preferably $1 \times 10^{18}$ atoms/cm$^2$ or less. The crystalline quality of the aluminum nitride single crystal layer, for example FWHM of the rocking curve of (0002) plane and (10-10) plane is 400 arcsec or less. Also, a radius of the curvature of the principal plane at the aluminum nitride substrate is preferably 1 m or more. The larger the upper limit of the radius of the curvature is, the better it is; however considering the industrial production, it is 10000 m or less. By using the aluminum nitride single crystal layer satisfying above conditions, the group III nitride layered product and the group III nitride semiconductor element with even higher quality can be produced.

In the present invention, the thickness of the aluminum nitride substrate is not particularly limited, however it is preferably within the range as mentioned below. Specifically, in case the aluminum nitride substrate is made of only single layer of aluminum nitride single crystal layer, it is preferably 10 to 2000 µm. Also, in case it is formed of the layer made of aluminum nitride of non-single crystal (non-single crystal layer) and the aluminum nitride layer, the thickness of the aluminum nitride layer is preferably 0.005 to 300 µm, and the thickness of non-single crystal layer is preferably 10 to 2000 µm.

As the thickness of the aluminum nitride substrate and the aluminum nitride single crystal layer satisfying said ranges, the group III nitride layered product and the group III nitride semiconductor element with even higher quality can be obtained, and the production thereof become easy.

The aluminum nitride substrate of the present invention is characterized by the aluminum nitride single crystal layer part comprising at least on a surface thereof an aluminum nitride single crystal layer having a plane inclined to "m" axis direction within a range of 0.05° or more and 0.40° or less from (0001) plane of a wurzite structure as the principal plane. This aluminum nitride single crystal layer is produced by producing the aluminum nitride single crystal layer by the known methods, and then by carrying out the processing such as polishing or so, particularly of the chemical mechanical polishing (CMP), to the obtained aluminum nitride single crystal layer.

(The Production of the Aluminum Nitride Substrate: The Growth of the Aluminum Nitride Single Crystal Constituting the Aluminum Nitride Single Crystal Layer)

First, specifically the aluminum nitride single crystal layer is grown by a vapor phase growth method such as hydride vapor phase epitaxy (HVPE) method, metal organic chemical vapor deposition (MOCVD) method, physical vapor transport (PVT) method, molecular beam epitaxy (MBE) method or so, or by liquid phase growth method such as liquid phase epitaxy (LPE) method or so. Among these, considering the productivity and the light extraction of the group III nitride semiconductor element which is obtained at the end, it is preferable to grow the aluminum nitride single crystal layer by HVPE method. Particularly, the part constituting the aluminum nitride single crystal layer is preferably produced by HVPE method.

As for the production method when the aluminum nitride substrate of the present invention is a single layer, for example, it can be produced by the method described in Japanese Patent Application Laid Open No. 2009-190960. Also, the multilayer substrate comprising polycrystal layer or amorphous layer can be produced by the method for example described in Japanese Patent Application Laid Open No. 2009-161390. Particularly, in case of producing the aluminum nitride substrate having high crystalline quality and high ultraviolet light transmittance, as reported in Y. Kumagai, et. al. Applied Physics Express 5 (2012) 055504, the layered product wherein the thick film of single crystal aluminum nitride is grown by HVPE method on the aluminum nitride substrate formed by sublimation method can be used. In this case, the aluminum nitride single crystal layer is preferably a thick film of the single crystal aluminum nitride grown by HVPE method. Also, the above mentioned layered product can be the aluminum nitride substrate of the single layer made of thick film of the single crystal aluminum nitride.

(The Production of the Aluminum Nitride Single Crystal Layer: The Processing Method of the Principal Plane)

By polishing said substrate plane of the aluminum nitride substrate prepared by the above method, it can be processed into the aluminum nitride substrate comprising at least on a surface thereof an aluminum nitride single crystal layer having a plane inclined to "m" axis direction within a range of 0.05° or more and 0.40° or less from (0001) plane of a wurzite structure as the principal plane, which is the first present invention. For example, CMP (Chemical mechanical polishing) method generally can be used when preparing epi-ready substrate. Considering the flatness of the substrate surface of after the polishing, CMP method is preferably used. In the present embodiment, c-plane aluminum nitride substrate is polished.

In CMP, the aluminum nitride substrate is chemically and mechanically polished using the slurry dispersed with abrasive grains. "Mechanically" refers to physically polishing by rotating the aluminum nitride substrate while placing the substrate between two polishing pads, and supplying the slurry. "Chemically" refers to chemically etching the surface of the aluminum nitride by making the slurry acidic or basic. In CMP method, by combining the mechanical polishing and the chemical polishing, the substrate with flat surface can be obtained efficiently. During the mechanical polishing, the aluminum nitride substrate is held on the holding table capable of adjusting the angle of the inclination, and the angle of the inclination of the holding table is set so that the angle of the polished plane (which becomes the principal plane) against (0001) plane of a wurzite structure become predetermined angle as mentioned above, and then the polishing is carried out.

The force of the polishing pad pressing the aluminum nitride substrate, and the rotation speed of the polishing pad can be adjusted appropriately, which are not particularly limited. If the force of the polishing pad pressing the aluminum nitride substrate is too strong, or if the rotational speed is too fast, the aluminum nitride substrate may be broken. On the other hand, if the force of the polishing pad pressing the aluminum nitride substrate is too weak or the rotational speed is too slow, the polishing speed may become slow.

The abrasive grains in the slurry is not particularly limited as long as it is a hard material than the aluminum nitride, and diamond, SiC, $Al_2O_3$ or so may be mentioned. The pH of the slurry is not particularly limited, however it is generally carried out under the basic condition of pH of 8 or higher, or under acidic condition of pH of 6 or less. The grain diameter of the abrasive grain is not particularly limited, however it is used from the larger diameter of the diameter range of 0.1 to 15 μm.

The aluminum nitride single crystal layer is processed by the above mentioned method, and thereby the principal plane of the aluminum nitride single crystal layer may be formed. Next, the group III nitride layered product and the group III nitride semiconductor element including this aluminum nitride single crystal layer will be explained.

(The Group III Nitride Layered Product and the Group III Nitride Semiconductor Element)

In the present invention, to the surface of the aluminum nitride substrate (the principal plane of the aluminum nitride single crystal layer) produced by the method discussed in above, the group III nitride single crystal layer is grown. Then, the group III nitride layered product and the group III nitride semiconductor element including the layered product thereof are produced.

Figure 2:
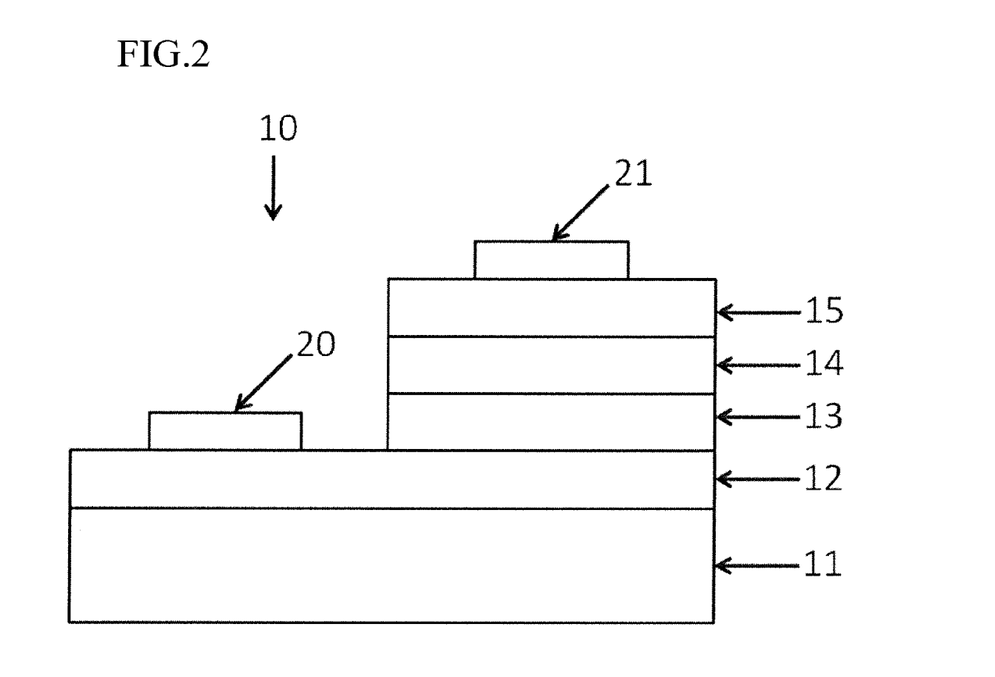
FIG. 2 is a cross section of the group III nitride semiconductor element according to one embodiment of the present invention.

Hereinbelow, the group III nitride semiconductor element (the light emitting element) which is one embodiment of the present invention will be described. As shown in FIG. 2, the group III nitride semiconductor element 10 comprises the structure wherein the "n" layer 12 (n-type clad layer), the quantum well layer 13, the "p" layer 14 (p-type clad layer), and the p-type cap layer 15 are stacked on the aluminum nitride substrate 11 in this order. Further, the negative electrode 20 is formed at the "n" layer 12, and the positive electrode 21 is formed at the p-type cap layer 15. Although each layer is not particularly limited, it is preferable to grow these layers by MOCVD method (metal organic chemical vapor deposition method).

Also, before forming the "n" layer 12, in order to improve the crystalline quality, the buffer layer may be formed having the same lattice constant as the aluminum nitride substrate (the aluminum nitride single crystal layer) and the "n" layer or the intermediate lattice constant thereof. The thickness of this buffer layer is not particularly limited, however it is 2 nm to 1000 nm. Note that, by using the aluminum nitride substrate with high crystalline quality, a high quality group III nitride semiconductor element can be formed without forming this buffer layer.

The donor impurity atom of the "n" layer 12 is not particularly limited, but Si can be used. The concentration is not particularly limited, however it is preferably $10^{17}$ to $10^{20}$ $cm^{-3}$. Note that, the thickness of the "n" layer is not particularly limited, however it is 200 nm to 3000 nm.

The quantum well layer 13 preferably has the multiquantum well (MQW) structure wherein the well layer and the barrier layer are stacked repeatedly. Also, the thickness of the quantum well layer 13 is not particularly limited, however the well layer is 1 to 5 nm, and the barrier layer is 2 to 50 nm. The number of the repeats is not particularly limited, however it is 1 to 10 times.

The "p" layer 14 is doped with the acceptor impurity atom and shows the p-type characteristic. The acceptor impurity atom is not particularly limited, however Mg, Zn, Ca, Cd, Be or so may be mentioned. Among these, Mg and Be are preferable. Also, the concentration of the donor impurity is preferably $10^{17}$ to $10^{20}$ $cm^{-3}$. The thickness of the "p" layer 14 is not particularly limited, however it is 5 to 200 nm.

Also, before forming the "p" layer 14, in order to improve the electron injection efficiency, the electron block layer having larger band gap energy than said "p" layer can be formed. The thickness of the block layer is not particularly limited, however it is 2 nm to 100 nm.

The p-type cap layer 15 tends to easily obtain high hole concentration, and it is to have the ohmic contact with the metal constituting the positive electrode 21, and it is preferably formed of GaN layer. The p-type cap layer 15 is doped with the acceptor impurity atom, and the concentration of the impurity atom is preferably $10^{17}$ to $10^{20}$ $cm^{-3}$. This p-type cap layer 15 may be adjusted to have desired composition by changing the source material gas, the supplying ratio of the source material gas of the donor impurity atom. The thickness of the p-type cap layer is not particularly limited, however it is 2 to 3000 nm.

The group III nitride layered product of the present invention comprises at least the layer formed of the group III nitride single crystal on the aluminum nitride substrate. Among these, the aluminum nitride substrate of the present invention exhibits excellent effect when at least one layer of the group III nitride single crystal layer satisfies a composition shown by $Al_{1-(x+y+z)}Ga_xIn_yB_zN$ (note that, x, y, and z are independently a rational number of 0 or more and less than 0.5 respectively, and a sum of x, y, and z is less than 0.5). That is, in case the group III nitride single crystal layer having close lattice constant to aluminum nitride is formed on the aluminum nitride substrate, the excellent effect can be exhibited. Note that, said AlGaInBN layer only needs to be present on the aluminum nitride substrate, and it may be directly layered on the principal plane of the aluminum nitride substrate, or it may be layered via other group III nitride single crystal layer. Particularly, it is preferable to grow said AlGaInBN layer (including AlN layer) directly on the principal plane of the aluminum nitride substrate. Further specifically, in case of the deep ultraviolet light-emitting element, the "n" layer and the "p" layer is preferably said AlGaInBN layer. Therefore, for example, the well layer of the quantum well layer may be formed from the group III nitride single crystal layer wherein the content of Al ratio is less than 50 atom %.

Also, in AlGaInBN layer, said $Al_{1-(x+y+z)}Ga_xIn_yB_zN$ preferably satisfies $0 \leq x \leq 0.4$, $0 \leq y \leq 0.01$, $0 \leq z \leq 0.01$ and $0 \leq x+y+z \leq 0.42$; and more preferably satisfies $0.2 \leq x \leq 0.4$, $0 \leq y \leq 0.01$, $0 \leq z \leq 0.01$ and $0.2 \leq x+y+z \leq 0.42$.

(The Characteristic of the Group III Nitride Layered Product)

The group III nitride layered product of the present invention is not particularly limited, however it can have the following characteristics.

In the group III nitride layered product of the present invention, in said $Al_{1-(x+y+z)}Ga_xIn_yB_zN$, in case the AlGaInBN layer is the layer wherein x being a rational number lager than 0 and less than 0.5, and y and z being a rational number of 0 or more and less than 0.5 and a sum of x, y, and z of more than 0 and less than 0.5; then for said AlGaInBN layer, in photoluminescence measurement at 300 K of said AlGaInBN layer, a luminescence peak corresponding to band gap energy of 4.56 eV or more and less than 5.96 eV is observed, and FWHM of said peak of 225 meV or less. In addition, a surface roughness (Ra) of said AlGaInBN layer can be 1.0 nm or less. That is, since FWHM of said peak is 225 meV or less, the AlGaInBN layer will be the high quality group III nitride layered product with further uniformed composition distribution and low impurity concentration. Also, since the surface roughness (Ra) is 1.0 nm or less, the AlGaInBN layer will have higher flatness. Usually, when the luminescence peak shifts to the low energy side, group III nitride tends to be grown in three-dimensional mode. Thus the fluctuation of the composition at the grown surface of the group III nitride tends to become large. Considering this, the AlGaInBN layer of the group III nitride preferably have luminescence peak observed at 4.56 eV or more and less than 5.96 eV, FWHM of the peak of 225 meV or less, and the surface roughness (Ra) of 1.0 nm or less. Further, it is further preferable that the luminescence peak is observed at 4.56 eV or more and less than 5.96 eV, FWHM of the peak is 225 meV or less, and the surface roughness (Ra) is 1.0 nm or less. Usually, considering the industrial productivity, the AlGaInBN layer of the group III nitride layered product preferably have the luminescence peak observed at 4.56 eV or more and less than 5.39 eV, FWHM of the peak of 50 meV or more and 225 meV or less, and the surface roughness (Ra) of 0.05 nm or more and 1.0 nm or less. The preferable composition of the AlGaInBN in this case is, $0 \leq x \leq 0.4$, $0 \leq y \leq 0.01$, $0 \leq z \leq 0.01$ and $0 \leq x+y+z \leq 0.42$; and more preferably satisfies $0.2 \leq x \leq 0.4$, $0 \leq y \leq 0.01$, $0 \leq z \leq 0.01$ and $0.2 \leq x+y+z \leq 0.42$.

Also, in the group III nitride layered product of the present invention, in case AlN layer (AlGaInBN layer wherein x, y and z being 0 in said $Al_{1-(x+y+z)}Ga_xIn_yB_zN$) is directly formed on the principal surface of said aluminum nitride single crystal layer, said AlN layer can have, in photoluminescence measurement at 300 K, FWHM of its luminescence peak of 145 meV or less, and a surface roughness (Ra) of 0.2 nm or less. Usually, considering the industrial productivity, the AlN layer of the group III nitride preferably has FWHM of its luminescence peak of 120 meV or more and 145 meV or less, and the surface roughness (Ra) of 0.05 nm or more and 0.2 nm or less.

The group III nitride semiconductor element including such group III nitride layered product can be used as high quality light emitting element.

(The Production Method of the Group III Nitride Layered Product and the Group III Nitride Semiconductor Element)

The group III nitride layered product and the group III nitride semiconductor element can be produced in accordance with the known methods, using MOCVD method.

That is, the desired AlGaInBN layer is grown by placing the aluminum nitride substrate 11 in the MOCVD apparatus, and setting to the desired temperature while flowing the hydrogen of the carrier gas and supplying the source material gas. As group III source material, trimethyl aluminum (TMA) and trimethyl gallium (TMG), trimethyl indium (TMIn), triethyl boron (TEB) or so can be used, and ammonia ($NH_3$) can be used as the group V source material. In addition to these gas, the source material gas of the donor impurity atom can be supplied accordingly. For example, in case of obtaining the "n" layer 12, tetraethyl silane is introduced into the reaction furnace, and in case of obtaining the "p" layer 14, cyclopentadienyl magnesium ($Cp_2Mg$) is introduced together with the carrier gas, the group III source material gas and the group V source material gas, thereby it can be grown.

By the method discussed hereinabove, the group III nitride layered product of the present invention can be produced. Note that, the above mentioned method is one example of the production method of the group III nitride layered product of the present invention.

(The Method of Forming the "n" Electrode (Negative Electrode 20) and the "p" Electrode (Positive Electrode 21))

The method of formation of the negative electrode 20 and the positive electrode 21 is not particularly limited, and the known methods can be used. The negative electrode 20 is formed on the exposed "n" layer 12 by carrying out the etching by known methods. As the negative electrode material, Al, Au, Ni, Cu or so may be mentioned. The positive electrode is formed on the p-type cap layer 15. As the positive electrode material, Al, Au, Ni, Cu or so.

As discussed in the above, the group III nitride semiconductor element of the present invention can be produced.

The group III nitride layered product obtained by the above mentioned method is grown on the aluminum nitride substrate of the present invention. Thus it has low dislocation density, uniform composition distribution, low impurity concentration and highly flat surface. As a result, the group III nitride semiconductor element (the light emitting element) including said group III nitride layered product is high quality.

EXAMPLE

Hereinbelow, the present invention will be described in detail using the specific examples and the comparative examples, however the present invention is not to be limited thereto.

(The Evaluation of the Crystalline Quality: The Evaluation of the Crystalline Quality of the Group III Nitride Single Crystal Layer (the Group III Nitride Layered Product))

(The Optical Characteristic Evaluation)

The crystalline quality was evaluated by the photoluminescence (it may simply referred as "PL") measurement at 300K. This is because FWHM of the luminescence peak of the quantum well layer depends on fluctuation of the composition or the impurity concentration in the quantum well layer. The evaluation of this FWHM can be carried out by the PL measurement using the above mentioned group III nitride layered product or the group III nitride semiconductor element. For the present invention, the evaluation (the evaluation of the composition distribution) of the group III nitride single crystal layer was carried out by PL measurement of, the layered product formed of the aluminum nitride substrate 11, "n" layer 12 and the quantum well layer 13 (the examples 1 to 3 and the comparative examples 1 to 4); the layered product formed of the aluminum nitride substrate 11 and "n" layer 12 (the examples 4 to 6 and the comparative examples 5 to 8); and the layered product layering the AlN layer directly on the aluminum nitride substrate 11 (the examples 7 to 9 and the comparative examples 9 to 12), as shown in FIG. 2. PL measurement was carried out using 193 nm ArF excimer laser. Note that, obviously, the shorter the FWHM is, the more uniform the composition distribution is.

(The Surface Roughness Evaluation: The Surface Roughness Evaluation of the Group III Nitride Single Crystal Layer (the Group III Nitride Layered Product))

(The Surface Morphology Evaluation)

The evaluation of the surface roughness of the AlN single crystal layer, "n" layer and the quantum well layer of the aluminum nitride substrate was carried out by measuring the range of 2 μm×2 μm using atomic force microscope (AFM). This is because the fluctuation of the composition in the quantum well layer and the intake of the impurity atom are thought to become large as the crystal surface roughness becomes larger. The surface roughness was evaluated by Ra. Ra is one of the evaluation standard of the surface roughness described in JIS B 0601, and it refers to the value obtained as follows; first taking a standard area (here it is 2 μm×2 μm) in the direction of average value thereof from the rough curved surface, second, in the region of the standard area, taking the total sum of the absolute value of the deviation between the averaged surface and the measured surface, and then dividing the sum by the standard area to get Ra. Note that, obviously, the smaller the value of Ra is, the more flat the surface is.

Example 1

The surface and the backside of the c-plane aluminum nitride substrate made of aluminum nitride single crystal having the thickness of about 500 μm was ground, and CMP polishing was carried out. Thereby, the aluminum nitride substrate (the aluminum nitride substrate consisting only of the AlN single crystal layer) having the thickness of 200 μm wherein the principal plane of the aluminum nitride substrate comprises the plane inclined to "m" axis direction at 0.11° from (0001) plane of a wurzite structure was obtained. The radius of the curvature of this aluminum nitride substrate was 20 m, and the surface roughness (Ra) was 0.17 nm. Also, the inclination to "a" axis direction from (0001) plane of a wurzite structure was 0.00°.

On this aluminum nitride substrate, 1 μm of "n" layer ($Al_{0.7}Ga_{0.3}N$) doped with Si was formed by MOCVD method. Then, the barrier layer and the well layer were formed on said "n" layer by MOCVD method so that the quantum well layer has the following structure. The barrier layer was 2 nm and was formed so that it satisfies the composition of $Al_{0.35}Ga_{0.65}N$; and the well layer was 7 nm and was formed so that it satisfies the composition of $Al_{0.7}Ga_{0.3}N$. This barrier layer and the well layer were formed for three repeats, and these layers were defined as the quantum well layer. The growth conditions were, the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD reactor, and PL measurement was carried out. As a result, the peak position of the luminescence peak derived from the quantum well layer was 4.76 eV, and its FWHM was 197 meV. The surface roughness (Ra) was 0.18 nm. The results are shown in Table 1.

Example 2

The same procedure and the evaluation were carried out as the example 1; except that the aluminum nitride substrate wherein the principal plane has the plane inclined to "m" axis direction at 0.23° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) of after the growth of the "n" layer and the quantum well layer, the peak position of the luminescence peak derived from the quantum well layer was 4.86 eV, and its FWHM was 203 meV. The surface roughness (Ra) was 0.20 nm. The results are shown in Table 1.

Example 3

The same procedure and the evaluation were carried out as the example 1; except that the aluminum nitride substrate wherein the principal plane has the plane inclined to "m" axis direction at 0.32° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) of after the growth of the "n" layer and the quantum well layer, the peak position of the luminescence peak derived from the quantum well layer was 4.79 eV, and its FWHM was 208 meV. The surface roughness (Ra) was 0.30 nm. The results are shown in Table 1.

Example 4

On the aluminum nitride substrate as same as the example 1, only the "n" layer ($Al_{0.7}Ga_{0.3}N$) of 1 μm doped with Si was formed by MOCVD method. The growth conditions were, the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD reactor, and PL measurement was carried out. As a result, the peak position of the luminescence peak derived from the "n" layer was 5.17 eV, and its FWHM was 211 meV. The surface roughness (Ra) was 0.17 nm. The results are shown in Table 1.

Example 5

The same procedure and the evaluation were carried out as the example 4; except that the aluminum nitride substrate wherein the principal plane has the plane inclined to "m" axis direction at 0.23° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer, the peak position of the luminescence peak derived from the "n" layer was 5.15 eV, and its FWHM was 219 meV. The surface roughness (Ra) was 0.21 nm. The results are shown in Table 1.

Example 6

The same procedure and the evaluation were carried out as the example 4; except that the aluminum nitride substrate wherein the principal plane has the plane inclined to "m" axis direction at 0.32° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer, the peak position of the luminescence peak derived from the "n" layer was 5.12 eV, and its FWHM was 220 meV. The surface roughness (Ra) was 0.24 nm. The results are shown in Table 1.

Example 7

On the aluminum nitride substrate as same as the example 1, only the AlN layer ($Al_{0.7}Ga_{0.3}N$) of 0.2 μm doped with Si was formed by MOCVD method. The growth conditions were the growth temperature of 1200° C., V/III ratio of 2500, the pressure inside the system of 35 mbar; and TMA TMG and ammonia (8.5 slm) diluted with hydrogen which are the source material gas were supplied.

The obtained substrate (the group III nitride layered product) was cooled and taken out from MOCVD reactor, and PL measurement was carried out. As a result, the peak position of the luminescence derived from the AlN layer was 5.96 eV, and its FWHM was 140 meV. The surface roughness (Ra) was 0.08 nm. The results are shown in Table 1.

Example 8

The same procedure and the evaluation were carried out as the example 7; except that the aluminum nitride substrate wherein the principal plane has the plane inclined to "m" axis direction at 0.23° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the AlN layer, the peak position of the luminescence peak derived from the AlN layer was 5.96 eV, and its FWHM was 141 meV. The surface roughness (Ra) was 0.09 nm. The results are shown in Table 1.

Example 9

The same procedure and the evaluation were carried out as the example 7; except that the aluminum nitride substrate wherein the principal plane has the plane inclined to "m" axis direction at 0.32° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the AlN layer, the peak position of the luminescence peak derived from the AlN layer was 5.96 eV, and its FWHM was 141 meV. The surface roughness (Ra) was 0.09 nm. The results are shown in Table 1.

Example 10

The same procedure and the evaluation were carried out as the example 1; except that the aluminum nitride substrate wherein the principal plane has the plane inclined to "m" axis direction at 0.14° and inclined to "a" direction at 0.24° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those same as the aluminum nitride substrate used in example 1 was used.

As a result of the PL measurement of the obtained substrate (the group III nitride layered product) after the growth of the "n" layer and the quantum well layer, the peak position of the luminescence derived from by the quantum well layer was 4.84 eV, and its FWHM was 208 meV. The surface roughness (Ra) was 0.29 nm. The results are shown in Table 1.

Example 11

The same procedure and the evaluation were carried out as the example 1; except that the aluminum nitride substrate wherein the principal plane has the plane inclined to "m" axis direction at 0.23° and inclined to "a" direction at 0.19° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.83 eV, and its FWHM was 209 meV. The surface roughness (Ra) was 0.23 nm. The results are shown in Table 1.

Example 12

The same procedure and the evaluation were carried out as the example 1; except that the aluminum nitride substrate wherein the principal plane has the plane inclined to "m" axis direction at 0.30° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.85 eV, and its FWHM was 199 meV. The surface roughness (Ra) was 0.11 nm. The results are shown in Table 1.

Example 13

The same procedure and the evaluation were carried out as the example 1; except that the aluminum nitride substrate wherein the principal plane has the plane inclined to "m" axis direction at 0.32° and inclined to "a" direction at 0.11° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.87 eV, and its FWHM was 206 meV. The surface roughness (Ra) was 0.22 nm. The results are shown in Table 1.

Example 14

On the aluminum nitride substrate as same as the example 10, only the "n" layer ($Al_{0.7}Ga_{0.3}N$) of 1 μm doped with Si was formed by MOCVD method. The growth conditions were the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD apparatus, and PL measurement was carried out. As a result, the peak position of the luminescence peak caused by the "n" layer was 5.20 eV, and FWHM was 215 meV. The surface roughness (Ra) was 0.20 nm. The results are shown in Table 1.

Example 15

On the aluminum nitride substrate as same as the example 11, only the "n" layer ($Al_{0.7}Ga_{0.3}N$) of 1 μm doped with Si was formed by MOCVD method. The growth conditions were the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD apparatus, and PL measurement was carried out. As a result, the peak position of the luminescence derived from the "n" layer was 5.16 eV, and its FWHM was 218 meV. The surface roughness (Ra) was 0.25 nm. The results are shown in Table 1.

Example 16

On the aluminum nitride substrate as same as the example 12, only the "n" layer ($Al_{0.7}Ga_{0.3}N$) of 1 μm doped with Si was formed by MOCVD method. The growth conditions were the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD apparatus, and PL measurement was carried out. As a result, the peak position of the luminescence peak derived from the "n" layer was 5.16 eV, and its FWHM was 209 meV. The surface roughness (Ra) was 0.15 nm. The results are shown in Table 1.

Example 17

On the aluminum nitride substrate as same as the example 13, only the "n" layer ($Al_{0.7}Ga_{0.3}N$) of 1 μm doped with Si was formed by MOCVD method. The growth conditions were the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD apparatus, and PL measurement was carried out. As a result, the peak position of the luminescence derived from the "n" layer was 5.17 eV, and its FWHM was 216 meV. The surface roughness (Ra) was 0.30 nm. The results are shown in Table 1.

Comparative Example 1

The same procedure and the evaluation were carried out as the example 1; except that the aluminum nitride substrate wherein the principal plane has the plane inclined to "m" axis direction at 0.03° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.74 eV, and its FWHM was 248 meV. The surface roughness (Ra) was 2.03 nm. The results are shown in Table 1.

Comparative Example 2

The same procedure and the evaluation were carried out as the example 1; except that the aluminum nitride substrate wherein the principal plane has the plane inclined to "m" axis direction at 0.41° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.67 eV, and its FWHM was 231 meV. The surface roughness (Ra) was 0.63 nm. The results are shown in Table 1.

Comparative Example 3

The same procedure and the evaluation were carried out as the example 1; except that the aluminum nitride substrate wherein the principal plane has the plane inclined to "m" axis direction at 0.64° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.70 eV, and its FWHM was 235 meV. The surface roughness (Ra) was 0.70 nm. The results are shown in Table 1.

Comparative Example 4

The same procedure and the evaluation were carried out as the example 1; except that the aluminum nitride substrate wherein the principal plane has the plane inclined to "m" axis direction at 0.81° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.68 eV, and its FWHM was 252 meV. The surface roughness (Ra) was 2.34 nm. The results are shown in Table 1.

Comparative Example 5

The same procedure and the evaluation were carried out as the example 4; except that the aluminum nitride substrate wherein the principal plane has the plane inclined to "m" axis direction at 0.03° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer, the peak position of the luminescence peak derived from the "n" layer was 5.16 eV, and its FWHM was 251 meV. The surface roughness (Ra) was 1.30 nm. The results are shown in Table 1.

Comparative Example 6

The same procedure and the evaluation were carried out as the example 4; except that the aluminum nitride substrate wherein the principal plane has the plane inclined to "m" axis direction at 0.41° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer, the peak position of the luminescence derived from the "n" layer was 5.13 eV, and its FWHM was 230 meV. The surface roughness (Ra) was 0.30 nm. The results are shown in Table 1.

Comparative Example 7

The same procedure and the evaluation were carried out as the example 4; except that the aluminum nitride substrate wherein the principal plane has the plane inclined to "m" axis direction at 0.81° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer, the peak position of the luminescence derived from the "n" layer was 5.08 eV, and its FWHM was 267 meV. The surface roughness (Ra) was 1.57 nm. The results are shown in Table 1.

Comparative Example 8

The same procedure and the evaluation were carried out as the example 7; except that the aluminum nitride substrate wherein the principal plane has the plane inclined to "m" axis direction at 0.03° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of AlN layer, the peak position of the luminescence peak derived from AlN layer was 5.96 eV, and its FWHM was 153 meV. The surface roughness (Ra) was 0.48 nm. The results are shown in Table 1.

Comparative Example 9

The same procedure and the evaluation were carried out as the example 7; except that the aluminum nitride substrate wherein the principal plane has the plane inclined to "m" axis direction at 0.41° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of AlN layer, the peak position of the luminescence peak derived from AlN layer was 5.96 eV, and its FWHM was 141 meV. The surface roughness (Ra) was 0.29 nm. The results are shown in Table 1.

Comparative Example 10

The same procedure and the evaluation were carried out as the example 7; except that the aluminum nitride substrate wherein the principal plane has the plane inclined to "m" axis direction at 0.81° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of AlN layer, the peak position of the luminescence derived from AlN layer was 5.96 eV, and its FWHM was 155 meV. The surface roughness (Ra) was 0.51 nm. The results are shown in Table 1.

Comparative Example 11

The same procedure and the evaluation were carried out as the example 1; except that the aluminum nitride substrate wherein the principal plane has the plane inclined to "m" axis direction at 0.42° and inclined to "a" direction at 0.15° from (0001) plane of a wurzite structure was used. For the physical properties (the crystalline quality, the radius of the curvature, the surface roughness (Ra), the thickness, and the inclination to "a" direction) of the principal plane except for the off angle of the principal plane, those as same as the aluminum nitride substrate used in example 1 was used.

As a result of the PL measurement of the obtained substrate (the group III nitride layered product) after the growth of the "n" layer and the quantum well layer, the peak position of the luminescence peak derived from the quantum well layer was 4.81 eV, and its FWHM was 241 meV. The surface roughness (Ra) was 0.72 nm. The results are shown in Table 1.

Comparative Example 12

On the aluminum nitride as same as the example 11, only the "n" layer ($Al_{0.7}Ga_{0.3}N$) of 1 μm doped with Si was formed by MOCVD method. The growth conditions were, the growth temperature of 1050° C., V/III ratio of 1400, the pressure inside the system of 50 mbar; and TMA TMG and ammonia (9.8 slm) diluted with hydrogen which are the source material gas were supplied.

The obtained substrate (the group III nitride layered product) was cooled and taken out from MOCVD apparatus, and PL measurement was carried out. As a result, the peak position of the luminescence peak derived from the "n" layer was 5.19 eV, and its FWHM was 237 meV. The surface roughness (Ra) was 0.37 nm. The results are shown in Table 1.

TABLE 1

| | Substrate off angle | | | PL peak position (eV) | PL peal hald band width (meV) | Surface roughness Ra (nm) |
|---|---|---|---|---|---|---|
| | m axis direction (°) | a axis direction (°) | Layer being analyzed | | | |
| Example 1 | 0.11 | 0 | quantum well layer | 4.76 | 197 | 0.18 |
| Example 2 | 0.23 | 0 | quantum well layer | 4.86 | 203 | 0.2 |
| Example 3 | 0.32 | 0 | quantum well layer | 4.79 | 208 | 0.3 |
| Example 4 | 0.11 | 0 | n layer | 5.17 | 211 | 0.17 |
| Example 5 | 0.23 | 0 | n layer | 5.15 | 219 | 0.21 |
| Example 6 | 0.32 | 0 | n layer | 5.12 | 220 | 0.24 |
| Example 7 | 0.11 | 0 | AlN layer | 5.96 | 140 | 0.08 |
| Example 8 | 0.23 | 0 | AlN layer | 5.96 | 141 | 0.09 |
| Example 9 | 0.32 | 0 | AlN layer | 5.96 | 141 | 0.09 |
| Example 10 | 0.14 | 0.24 | quantum well layer | 4.84 | 208 | 0.29 |
| Example 11 | 0.23 | 0.19 | quantum well layer | 4.83 | 209 | 0.23 |
| Example 12 | 0.3 | 0 | quantum well layer | 4.85 | 199 | 0.11 |
| Example 13 | 0.32 | 0.11 | quantum well layer | 4.87 | 206 | 0.22 |
| Example 14 | 0.14 | 0.24 | n layer | 5.2 | 215 | 0.2 |
| Example 15 | 0.23 | 0.19 | n layer | 5.16 | 218 | 0.25 |
| Example 16 | 0.3 | 0 | n layer | 5.16 | 209 | 0.15 |
| Example 17 | 0.32 | 0.11 | n layer | 5.17 | 216 | 0.3 |
| Comparative example 1 | 0.03 | 0 | quantum well layer | 4.74 | 248 | 2.03 |
| Comparative example 2 | 0.41 | 0 | quantum well layer | 4.67 | 231 | 0.63 |
| Comparative example 3 | 0.64 | 0 | quantum well layer | 4.7 | 235 | 0.7 |
| Comparative example 4 | 0.81 | 0 | quantum well layer | 4.68 | 252 | 2.34 |
| Comparative example 5 | 0.03 | 0 | n layer | 5.16 | 251 | 1.3 |
| Comparative example 6 | 0.41 | 0 | n layer | 5.13 | 230 | 0.3 |
| Comparative example 7 | 0.81 | 0 | n layer | 5.08 | 267 | 1.57 |
| Comparative example 8 | 0.03 | 0 | AlN layer | 5.96 | 153 | 0.48 |
| Comparative example 9 | 0.41 | 0 | AlN layer | 5.96 | 141 | 0.29 |
| Comparative example 10 | 0.81 | 0 | AlN layer | 5.96 | 155 | 0.51 |
| Comparative example 11 | 0.42 | 0.15 | quantum well layer | 4.81 | 241 | 0.72 |
| Comparative example 12 | 0.42 | 0.15 | n layer | 5.19 | 237 | 0.37 |

According to the above results, the group III nitride layered product obtained from the examples have small fluctuation of the composition distribution, and low impurity concentration, and also have small surface roughness (Ra). Also, as shown in the examples 1 to 3, when the quantum well layer is grown on the high quality "n" layer (AlGaInBN layer) shown in examples 4 to 6, said quantum well layer also has high quality.

NUMERICAL REFERENCES

1 Substrate principal plane
2 c-plane
3 Off angle
10 Group III nitride semiconductor element
11 Aluminum nitride substrate
12 "n" layer
13 Quantum well layer
14 "p" layer
15 p-type cap layer
20 Negative electrode
21 Positive electrode

The invention claimed is:
1. A group III nitride layered product, comprising:
an aluminum nitride substrate comprising at least on a surface thereof an aluminum nitride single crystal layer having a principal plane inclined to "m" axis direction within a range of 0.05° or more and 0.40° or less and inclined to "a" axis direction within a range of 0.00° or more and 0.40° or less from (0001) plane of the wurzite structure, and
an AlGaInBN layer which satisfies a composition shown by $Al_{1-(x+y+z)}Ga_xIn_yB_zN$, wherein x, y, and z are independently a rational number of 0 or more and less than 0.5 respectively, and a sum of x, y, and z is less than 0.5, on the principal plane of the aluminum nitride single crystal layer of the aluminum nitride substrate,
wherein x is a rational number larger than 0 and less than 0.5, and y and z are a rational number of 0 or more and less than 0.5, and
in photoluminescence measurement at 300 K of said AlGaInBN layer, a peak corresponding to band gap of said AlGaInBN layer of 4.56 eV or more and less than 5.96 eV is observed, and full width at half maximum is 225 meV or less.

2. A group III nitride semiconductor element comprising the group III nitride layered product as set forth in claim 1.

3. A group III nitride layered product, comprising:
an aluminum nitride substrate comprising at least on a surface thereof an aluminum nitride single crystal layer having a principal plane inclined to "m" axis direction within a range of 0.05° or more and 0.40° or less and inclined to "a" axis direction within a range of 0.00° or more and 0.24° or less from (0001) plane of the wurzite structure, and
an AlGaInBN layer which satisfies a composition shown by $Al_{1-(x+y+z)}Ga_xIn_yB_zN$, wherein x, y, and z are independently a rational number of 0 or more and less than 0.5 respectively, and a sum of x, y, and z is less than 0.5, on the principal plane of the aluminum nitride single crystal layer of the aluminum nitride substrate.

4. The group III nitride layered product as set forth in claim 3, wherein the AlGaInBN layer has a composition, in said $Al_{1-(x+y+z)}Ga_xIn_yB_zN$, x being a rational number larger than 0 and less than 0.5, and y and z being a rational number of 0 or more and less than 0.5, and
in photoluminescence measurement at 300 K of said AlGaInBN layer, a peak corresponding to band gap of said AlGaInBN layer of 4.56 eV or more and less than 5.96 eV is observed, and full width at half maximum is 225 meV or less.

5. The group III nitride layered product as set forth in claim 3, wherein AlN layer, x, y and z being 0 in said $Al_{1-(x+y+z)}Ga_xIn_yB_zN$, is directly formed on the principal plane of said aluminum nitride single crystal layer,
in photoluminescence measurement at 300 K of said AlN layer, full width at half maximum of luminescence peak corresponding to said AlN crystal is 145 meV or less, and
a surface roughness of said AlN layer is 0.2 nm or less.

6. A group III nitride semiconductor element comprising the group III nitride layered product as set forth in claim 3.

* * * * *